United States Patent
Narendra et al.

(10) Patent No.: US 7,199,657 B2
(45) Date of Patent: Apr. 3, 2007

(54) AMPLIFICATION GAIN STAGES HAVING REPLICA STAGES FOR DC BIAS CONTROL

(75) Inventors: Siva G. Narendra, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 10/953,178

(22) Filed: Sep. 30, 2004

(65) Prior Publication Data

US 2006/0066407 A1    Mar. 30, 2006

(51) Int. Cl.
*H03G 5/16* (2006.01)
(52) U.S. Cl. ............... 330/133; 330/253; 330/261; 330/267; 330/296; 330/134; 327/52; 327/53; 327/54; 327/56
(58) Field of Classification Search .......... 330/133, 330/310, 253, 261, 267, 296, 134; 327/52, 327/53, 54, 56
See application file for complete search history.

(56) References Cited

U.S. PATENT DOCUMENTS

| | | | |
|---|---|---|---|
| 5,834,974 A * | 11/1998 | Kim | ............ 330/253 |
| 5,973,526 A | 10/1999 | Dabral | |
| 6,614,301 B2 | 9/2003 | Casper et al. | |
| 6,697,611 B1 | 2/2004 | Franca-Neto | |
| 2002/0030533 A1 | 3/2002 | De et al. | |
| 2003/0005378 A1 | 1/2003 | Tschanz et al. | |
| 2005/0275462 A1* | 12/2005 | Heightley et al. | .......... 330/261 |

* cited by examiner

*Primary Examiner*—Michael B Shingleton
(74) *Attorney, Agent, or Firm*—Fleshner & Kim, LLP

(57) ABSTRACT

An amplification apparatus is provided that includes a plurality of gain stages including a first gain stage having first and second transistors and a second gain stage having third and fourth transistors. A plurality of replica stages may also be provided that includes a first replica stage and a second replica stage. Each replica stage may correspond/match one of the plurality of gain stages. An amplifying device may be provided to adjust a body potential of at least the first transistor of the first gain based on an output of the first replica stage and an output of the second replica stage.

28 Claims, 5 Drawing Sheets

US 7,199,657 B2

AMPLIFICATION GAIN STAGES HAVING REPLICA STAGES FOR DC BIAS CONTROL

FIELD

Embodiments of the present invention may relate to amplification circuits. More particularly, embodiments of the present invention may relate to amplification circuits having a replica stage to control DC bias conditions.

BACKGROUND

Amplifiers are used for many purposes. Amplifiers receive input signals, amplify them, and produce output signals having a larger amplitude. There are many different types of amplifier configurations. These different configurations often have a tradeoff between voltage gain and bandwidth in which the amplifier may operate. For example, a particular type of amplifier may operate at high frequency, but may not have a very high gain. Another type of amplifier may operate at a lower frequency, but may have a higher gain.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

The following represents brief descriptions of the drawings in which like reference numerals represent like elements and wherein.

DETAILED DESCRIPTION

Figure 1A:
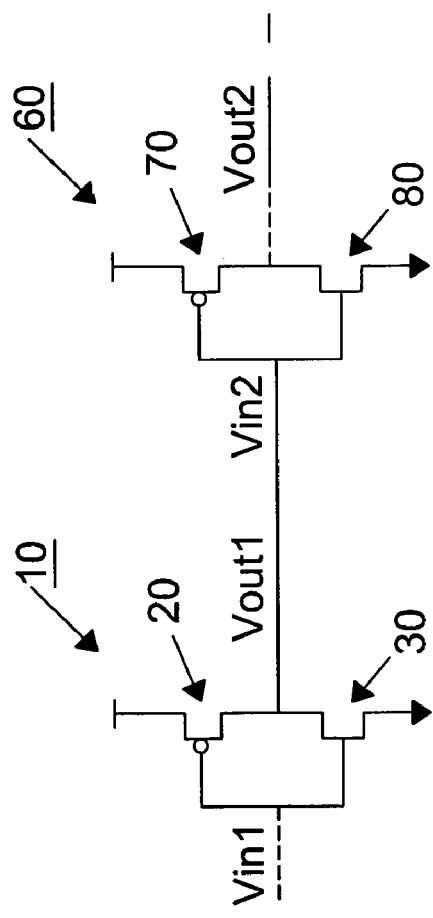
FIG. 1 is a circuit diagram of an amplifier configuration according to an example arrangement.
FIG. 1B are graphs corresponding to the FIG. 1A arrangement.

In the following detailed description, like reference numerals and characters may be used to designate identical, corresponding or similar components in differing figure drawings. Well-known power/ground connections to integrated circuits (ICs) and other components may not be shown within the figures for simplicity of illustration and discussion. Where specific details are set forth in order to describe example embodiments of the invention, it should be apparent to one skilled in the art that the invention can be practiced without these specific details.

Further, arrangements and embodiments may be described with respect to signal(s) and/or signal line(s). The identification of a signal or signal line may correspond to a single signal or a single signal line or may be a plurality of signals or plurality of signal lines. Additionally, the terminology of signal(s) and signal line(s) may be used interchangeably.

Wired and wireless receivers generally include a voltage amplification device that may include several voltage gain stages coupled together in series. The gain stages may operate at very high bandwidths depending on the receiver. For example, ultra-wideband receivers may operate up to 10 GHz. In order to provide a high gain, a plurality of gain stages may be needed. The following arrangements and embodiments will be described with respect to inverter-based gain stages that provide a required bandwidth. The use of inverter-based gain stages allows high bandwidth. However, these gain stages may only have one input, such that the DC bias and the AC signal path are the same. A proper DC bias operation may be used to maximize the voltage gain of each stage as will be described with respect to embodiments of the present invention.

FIG. 1A is a circuit diagram of an amplifier configuration according to an example arrangement. Other arrangements are also possible. More specifically, FIG. 1A shows two cascaded inverters 10 and 60 that function together as an amplifier. The inverter 10 may also hereafter be called a first stage inverter 10 and include a pMOS transistor 20 and an nMOS transistor 30, each having a gate, a drain, a source and a body. While FIG. 1 only shows two stages, other numbers of stages may also be provided. The transistors 20 and 30 receive an input Vin1 at their commonly coupled gates and provide an output Vout1 from their commonly coupled drains. Similarly, the inverter 60 may hereafter be called a second stage inverter 60 and include a pMOS transistor 70 and an nMOS transistor 80, each having a gate, a drain, a source and a body. The transistors 70 and 80 receive an input Vin2, at their commonly coupled gates and provide an output Vout2 from their commonly coupled drains. As may be seen from FIG. 1A, the output Vout1 of the inverter 10 is provided as the input Vin2 to the inverter 60. Thus, the output Vout1 affects the DC bias of the second stage inverter 60.

Figure 1B:
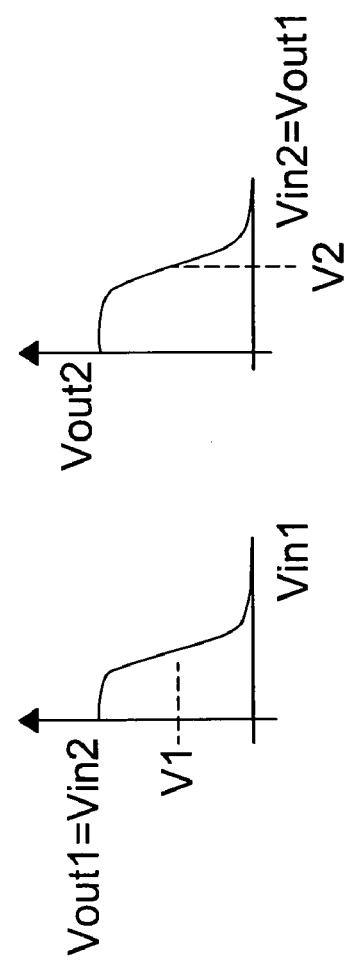

FIG. 1B are graphs corresponding to the FIG. 1A arrangement. These graphs show various signals from the inverters 10 and 60. The left hand graph shows an input (Vin1) and output (Vout1) relationship of the first stage inverter 10. The right hand graph shows an input (Vin2) and output (Vout2) relationship of the second stage inverter 60. In these graphs, voltage V1 represents a bias condition of the first stage inverter 10 and voltage V2 represents a bias condition of the second stage inverter 60. The bias conditions (or bias voltages) represent a maximum gain (or ideal gain) of an input AC signal for that respective inverter.

FIG. 1A shows that the output (Vout1) of the first stage inverter 10 corresponds to the input (Vin2) of the second stage inverter 60. Accordingly, in order to get a proper voltage gain though the second stage inverter 60, the DC operation point of the first stage inverter 10 should be set such that the bias voltage V1 is equal to the bias voltage V2 (i.e., V1=V2). This may be achieved by the original design and/or manufacture of the amplification configuration (i.e., the amplifier). However, due to process variations during manufacturing and/or subsequent events, it may be impractical to properly accomplish this design since the design points may have shifted. This may be especially true for sub-100 nm CMOS devices that have a very high frequency operation capacity.

Figure 2:
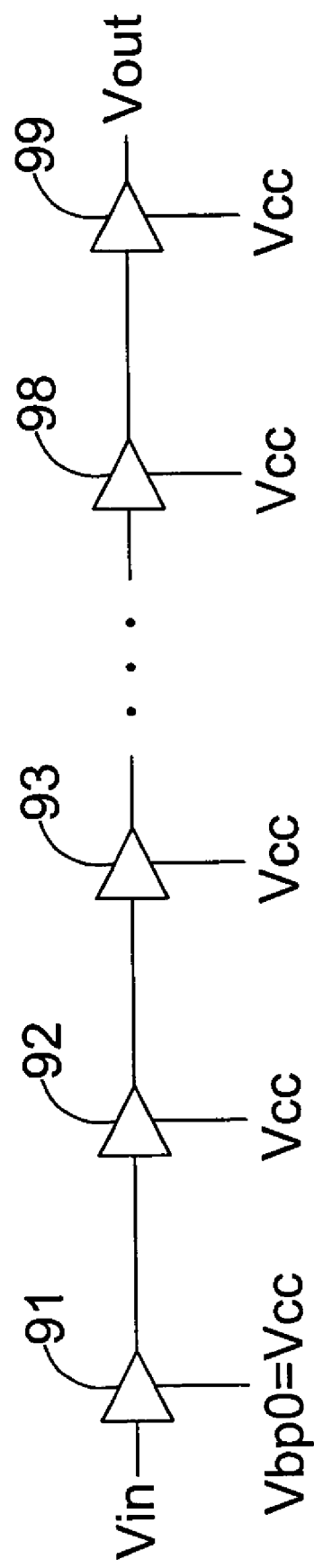
FIG. 2 shows an amplifier configuration having a plurality of gain stages according to an example arrangement.

FIG. 2 shows an amplifier configuration having a plurality of gain stages according to an example arrangement. Other arrangements are also possible. In this configuration, each of the respective stages may correspond to one of the stages of the FIG. 1 arrangement. This configuration having a plurality of coupled stages may be used when each stage operates at a high frequency but without any substantially gain. By properly coupling a plurality of gain stages, a higher overall gain of the amplifier may be realized while still operating at the high frequency.

More specifically, FIG. 2 shows inverters 91, 92, 93, 98 and 99, each of which may correspond to one of the inverters 10, 60 of the FIG. 1 arrangement. Other inverters or gain stages are not shown in FIG. 2 for ease of illustration. The first stage (or inverter 91) receives an input Vin and provides an output to the next stage (or inverter 92), which in turn provides an output to the following stage (or inverter 93). The final stage (or inverter 99) may provide an output Vout from the amplifier configuration.

Figure 3:
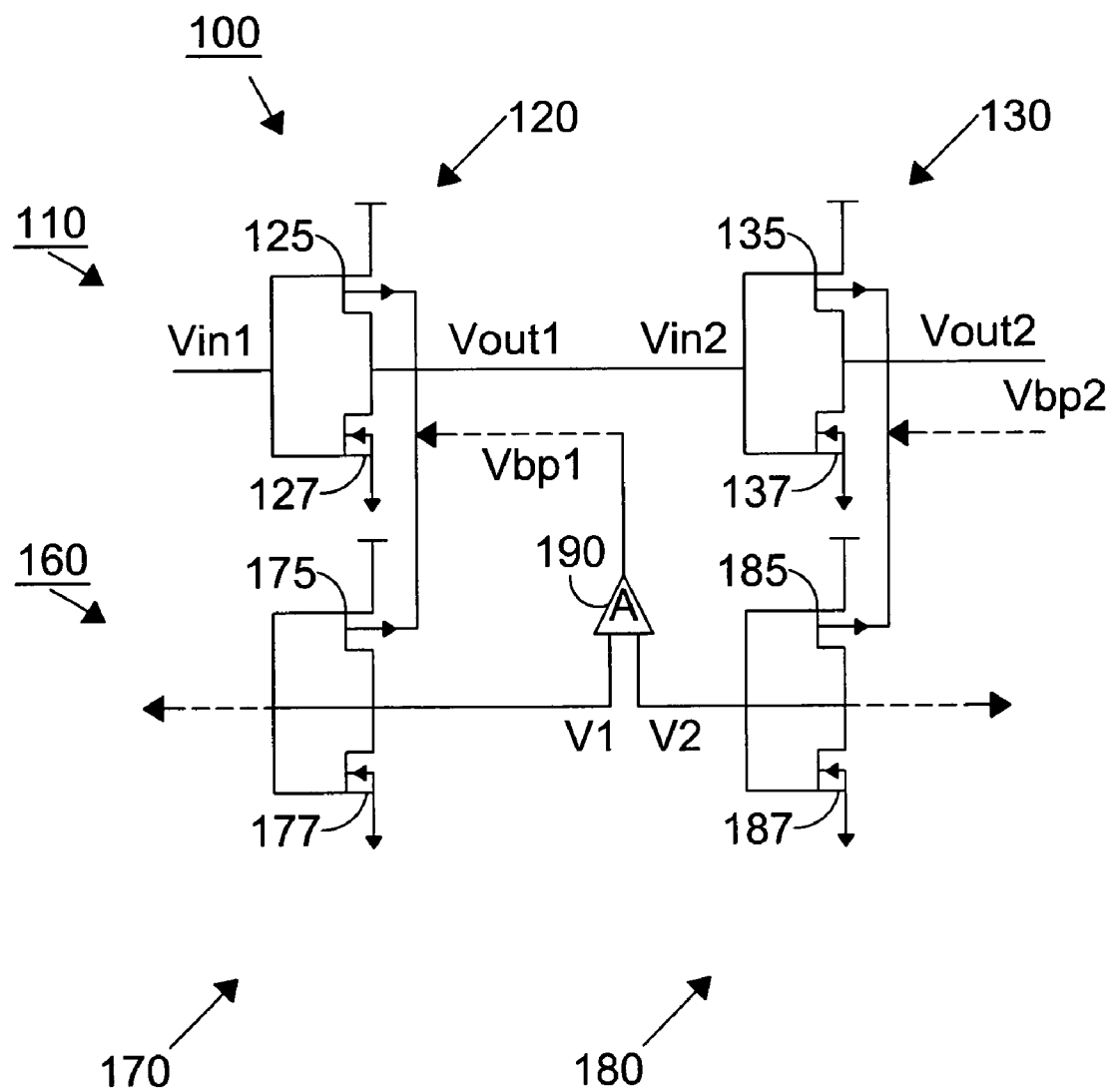
FIG. 3 is a circuit diagram of an amplifier configuration according to an example embodiment of the present invention.

FIG. 3 is a circuit diagram of an amplifier configuration 100 according to an example embodiment of the present invention. Other embodiments and configurations are also within the scope of the present invention. More specifically, the amplifier configuration 100 includes a high frequency gain path portion 110 and a replica stage portion 160. Each of the portions 110 and 160 includes two stages of the amplifier configuration 100 although other numbers of stages are also within the scope of the present invention and may be coupled to and/or within the configuration 100 as will be further described below with respect to FIG. 4.

More specifically, the high frequency gain path portion 110 includes two cascaded inverters 120 and 130. The inverter 120 may also be referred to as a first stage inverter 120 and include a pMOS transistor 125 and an nMOS transistor 127, each having a gate, a drain, a source and a body. The transistors 125 and 127 receive an input Vin1 at their commonly coupled gates and provide an output Vout1 from their commonly coupled drains. Similarly, the inverter 130 may also be referred to as a second stage inverter 130 and include a pMOS transistor 135 and an nMOS transistor 137, each having a gate, a drain, a source and a body. The transistors 135 and 137 receive an input Vin2 at their commonly coupled gates and provide an output Vout2 from their commonly coupled drains. As may be seen from FIG. 3, the output Vout1 of the first stage inverter 120 may be provided as the input Vin2 to the second stage inverter 130. Thus, the output Vout1 affects the DC bias of the second stage inverter 130. One skilled in the art would understand that the output Vout1 of the first stage inverter 120 may not directly and exactly correspond to Vin2 since a capacitor or other element may be provided between the inverters 120 and 130.

The replica stage portion 160 includes inverters 170 and 180. The inverter 170 of the replica stage portion 160 (also hereafter called the first stage replica inverter 170) matches the inverter 120 of the high frequency gain portion 110. Likewise, the inverter 180 of the replica stage portion 160 (also hereafter called the second stage replica inverter 180) matches the inverter 130 of the high frequency gain portion 110. One skilled in the art would understand that matching of transistors relates to matching of electrical properties and/or layout of the transistors. In other words, the respective pMOS transistors are matched to the pMOS transistors and the nMOS transistors are matched to the nMOS transistors. There are several well known matching techniques and thus will not be further described.

The inverter 170 of the replica stage portion 160 includes a pMOS transistor 175 that matches the pMOS transistor 125 of the high frequency gain portion 110 and an nMOS transistor 177 that matches the nMOS transistor 127 of the high frequency gain portion 110. Each of the transistors 175 and 177 have a gate, a drain, a source and a body. The transistors 175 and 177 have commonly coupled gates (or shorted gates) and commonly coupled drains so as to generate an output voltage V1, which is a DC bias condition for the inverter 120 (of the high frequency gain portion 110). This output V1 also represents a high gain. Additionally, the inputs of the transistors 175, 177 are coupled to the outputs of the transistors 175, 177.

The inverter 180 of the replica stage portion 160 includes a pMOS transistor 185 that matches the pMOS transistor 135 of the high frequency gain portion 110 and an nMOS transistor 187 that matches the nMOS transistor 137 of the high frequency gain portion 110. Each of the transistors 185 and 187 have a gate, a drain, a source and a body. The transistors 185 and 187 have commonly coupled gates (or shorted gates) and commonly coupled drains so as to generate an output voltage V2, which is a DC bias condition for the inverter 130 (of the high frequency gain portion 110). This output V2 also represents a high gain. Additionally, the inputs of the transistors 185, 187 are coupled to the outputs of the transistors 185, 187.

As stated above, in order to get a proper voltage gain across stages, the bias voltage V1 should be equal to the bias voltage V2. Accordingly, the outputs V1 and V2 of the inverters 170 and 180 of the replica bias portion 160 are input to an amplifier 190 that provides a high gain. The amplifier 190 provides an output Vbp1 to the body (or body potential) of both the transistor 125 of the first stage inverter 120 and the transistor 175 of the first stage replica inverter 170. Although this discussion relates to the amplifier 190 as being separate from the replica stage portion 160, the amplifier 190 may also be considered as part of the replica stage portion 160. The amplifier 190 operates to adjust the output voltage V1 by biasing the body potentials of the inverters 125 and 175 until V1=V2. This allows the output Vout1 of the first stage inverter 120 to be at a proper DC bias potential for the second stage inverter 130. In other words, the output Vout1 of the first stage inverter 120 is adjusted to a proper level to correspond with the input Vin2 of the second stage inverter 130. As such, the proper condition of V1=V2 may be provided through the use of replica stages that are matched to the high frequency gain stages. The amplifier 190 operates to apply a forward bias to body-to-source diodes of the transistor 125 and the transistor 195 to reduce a threshold voltage. The amplifier 190 accordingly adjusts the body potential within a bias range that covers forward and reverse bias of body-to-source diodes of at least the transistors 125 and 175.

The body bias Vbp1 applied to the first stage inverter 120 and the first stage replica inverter 170 may be adjusted such that V1=V2. This may ensure that the maximum gain is achieved in the following inverter stage. That is, the use of inverters 170 and 180 allows control of the body potential in the first stage inverter 120. This type of configuration may be continued for subsequent stages of the high frequency gain portion 110. For example, FIG. 3 also shows a body bias Vbp2 that will be applied to the body bias of the transistors 135 and 185 of the second stage. This body bias Vbp2 may be created in a similar manner using a replica circuit of the second and third stages of the high frequency gain portion 110.

Figure 4:
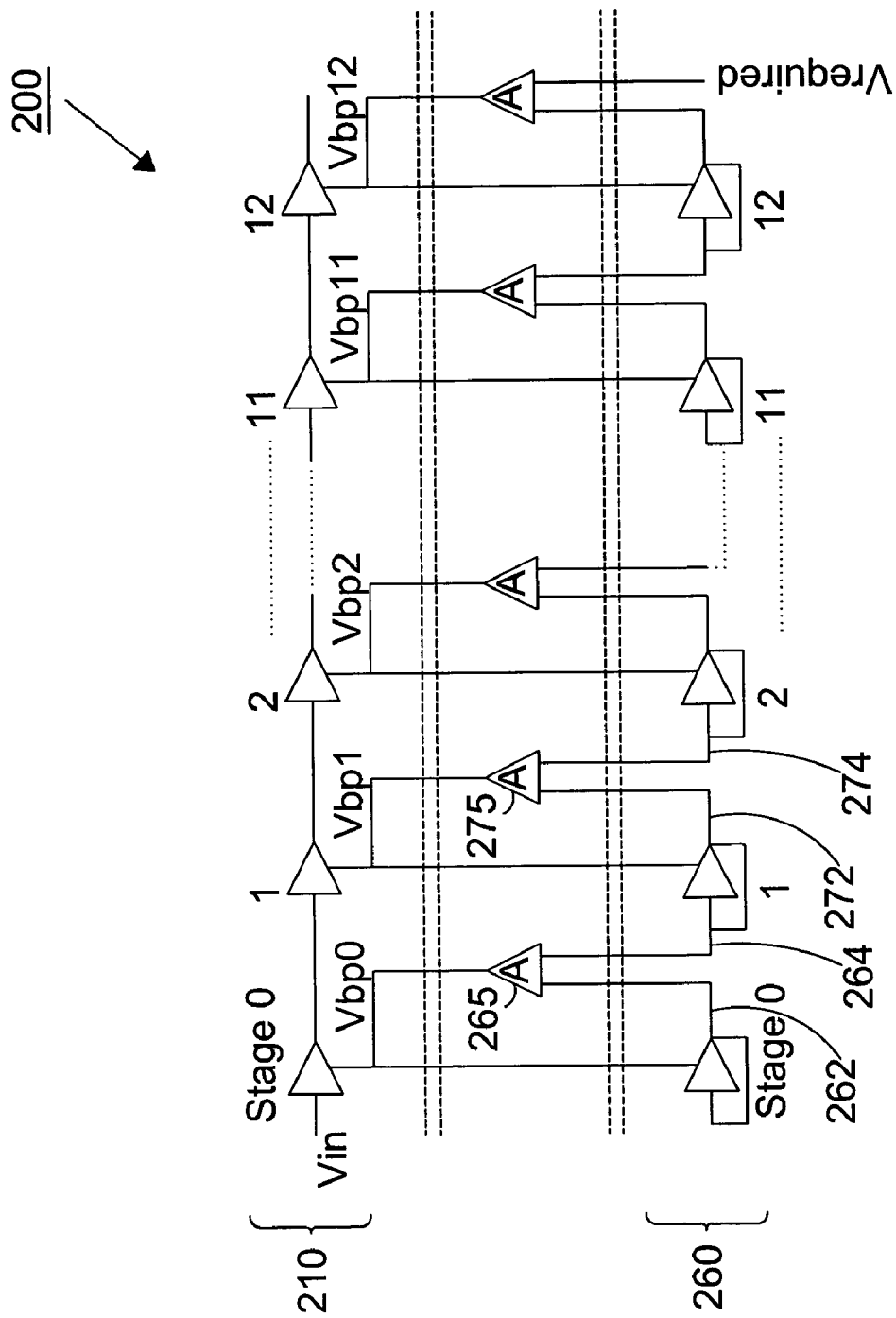
FIG. 4 shows an amplifier configuration having a plurality of gain stages according to an example embodiment of the present invention.

FIG. 4 shows an amplifier configuration 200 having a plurality of gain stages according to an example embodiment of the present invention. Other embodiments, configurations and numbers of stages are also within the scope of the present invention. More specifically, FIG. 4 shows a high frequency gain portion 210 and a replica bias portion 260. The high frequency gain portion 210 may correspond to the high frequency gain portion 110 of FIG. 3 and the replica bias portion 260 may correspond to the replica bias portion 160 of FIG. 3.

FIG. 4 shows various stages, including stage 0, stage 1, stage 2, stage 11 and stage 12. The other stages are not shown for ease of illustration and discussion. This cascaded amplifier configuration 200 operates in a similar manner as discussed above with respect to FIG. 3. For example, output 262 of replica stage 0 and output 264 of replica stage 1 are input to amplifier 265. In this example, the amplifier 265 of FIG. 4 may correspond to the amplifier 190 of FIG. 3. The amplifier 265 provides an output Vbp0 to a body potential of the inverters in stage 0 (i.e., both pMOS inverters of the high frequency gain portion 210 and the replica bias portion 260). Likewise, output 272 of the replica stage 1 and output 274 of the replica stage 2 are input to amplifier 275, which also may correspond to the amplifier 190 in FIG. 3 although provided in another stage. The amplifier 275 provides an output Vbp1 to a body potential of the inverters in stage 1 (i.e., both pMOS inverters of the high frequency gain portion 210 and the replica bias portion 260). This type of methodology may continue until the final stage of the amplifier configuration 200 (such as until stage 12). A discussion of the remaining stages of the configuration 200 will not be provided for ease of illustration. It should be noted that a final voltage may be provided at that final stage that includes a fixed or predetermined input to the final amplifier (since no further stages are provided for that amplifier configuration).

The configuration described above may allow a DC bias to stabilize across the amplifier upon turning ON the power of the amplifier. This will allow all stages of the amplifier to have a voltage gain since the proper DC bias conditions are provided at each stage. This may allow control of DC bias operations of the high bandwidth stages through body bias control.

Although embodiments of the present invention have been described with respect to inverter-based amplifiers, embodiments of the present invention are not limited to only those types. That is, the use of replica stage and DC bias operation control through body bias may be implemented into other amplifier configurations. Additionally, while the above discussion related to pMOS body bias, nMOS body bias may also be used in accordance with embodiments of the present invention.

Figure 5:
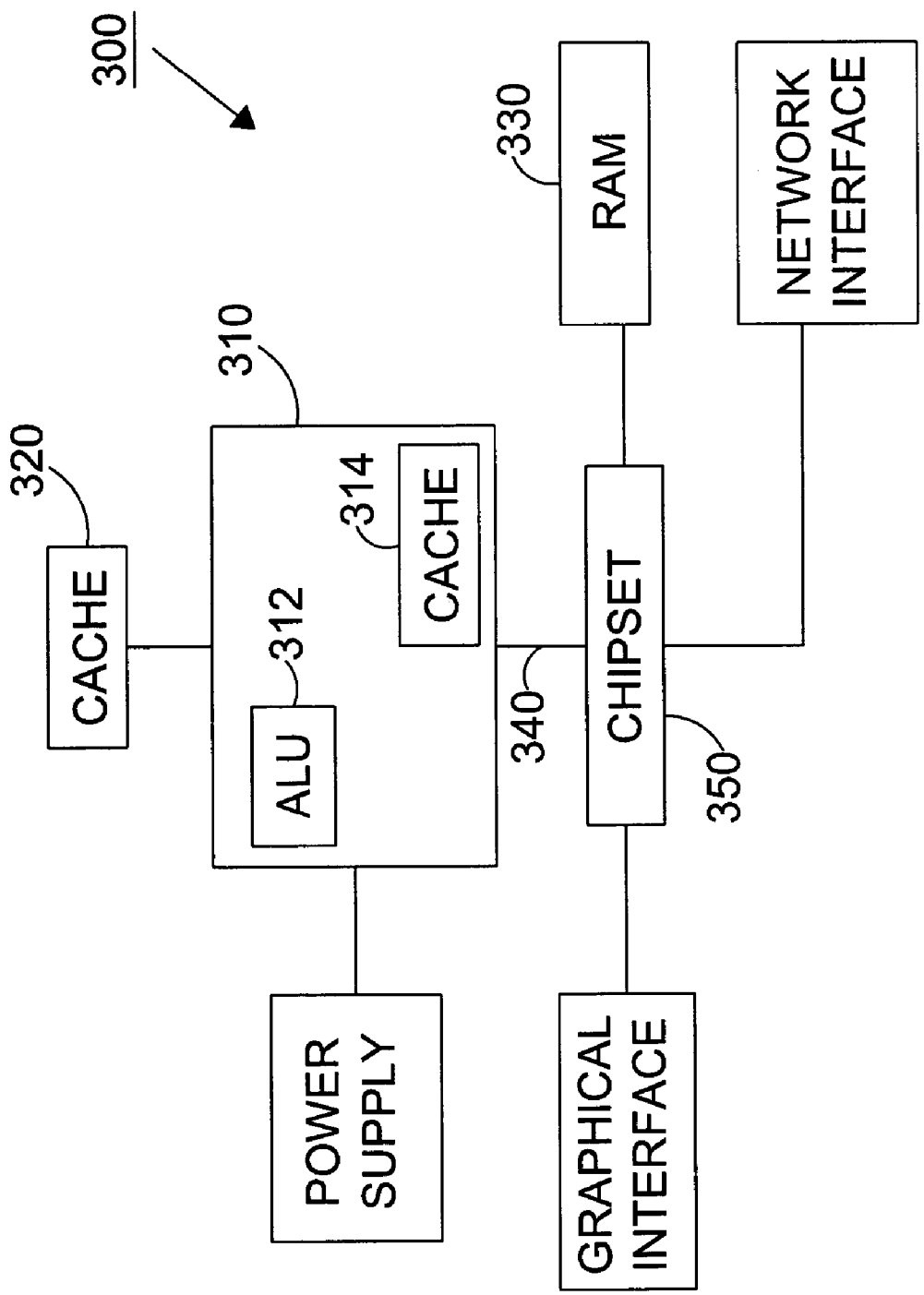
FIG. 5 is a system level block diagram according to an example embodiment of the present invention.

FIG. 5 is a system level block diagram of a system (such as a computer system 300) according to an example embodiment of the present invention. Other embodiments and configurations are also within the scope of the present invention. More specifically, the computer system 300 may include a microprocessor 310 that may have many sub-blocks such as an arithmetic logic unit (ALU) 312 and an on-die cache 314. Microprocessor 310 may also communicate to other levels of cache, such as off-die cache 320. Higher memory hierarchy levels such as a system memory (or RAM) 330 may be accessed via a host bus 340 and a chip set 350. In addition, other off-die functional units such as a graphics accelerator and a network interface controller, to name just a few, may communicate with the microprocessor 310 via appropriate busses or ports.

Embodiments of the present invention utilizing an amplification device as discussed above may be provided within the system 300, such as within an input device (or receiver) of the electronic system. As one example, the amplification configuration shown in FIGS. 3 and 4 may be provided with the microprocessor 310 and/or within another device. The receiver may receive data and be properly amplified using an amplification configuration according to an example embodiment of the present invention. This data may be processed and/or subsequently transmitted out of the system using a transmitting device, for example.

Embodiments of the present invention may also be provided within any of a number of example electronic systems including electrical and/or optical interconnection and communication products. Examples of represented systems include computers (e.g., desktops, laptops, handhelds, servers, tablets, web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An amplification apparatus comprising:

a plurality of gain stages including a first gain stage having first and second transistors and a second gain stage having third and fourth transistors, the first and second transistors having commonly coupled drains and the third and fourth transistors having commonly coupled gates, the first gain stage to provide an output from the commonly coupled drains of the first and second transistors to the commonly coupled gates of the third and fourth transistors;

a plurality of replica stages including a first replica stage and a second replica stage, each replica stage corresponding with one of the plurality of gain stages; and an amplifying device to adjust a body potential of at least the first transistor of the first gain stage.

2. An apparatus comprising:
a first gain stage having first and second transistors;
a first replica stage having a first transistor to substantially match the first transistor of the first gain stage and a second transistor to substantially match the second transistor of the first gain stage, the first replica stage to provide a first output signal;
a second gain stage having third and fourth transistors;
a second replica stage having a third transistor to substantially match the third transistor of the second gain stage and a fourth transistor to substantially match the fourth transistor of the second gain stage, the second replica stage to provide a second output signal; and
a biasing device to receive the first output signal from the first replica stage and to receive the second output signal from the second replica stage, the biasing device to adjust a DC bias applied to the first gain stage based on the first output signal and the second output signal, the biasing device to provide a body potential to the first transistor of the first gain stage and to the first transistor of the first replica storage.

3. An apparatus comprising:
a first gain stage having first and second transistors;
a first replica stage having a first transistor to substantially match the first transistor of the first gain stage and a second transistor to substantially match the second transistor of the first gain stage, the first replica stage to provide a first output signal;
a second gain stage having third and fourth transistors;
a second replica stage having a third transistor to substantially match the third transistor of the second gain stage and a fourth transistor to substantially match the fourth transistor of the second gain stage, the second replica stage to provide a second output signal;
a biasing device to receive the first output signal from the first replica stage and to receive the second output signal from the second replica stage, the biasing device to adjust a DC bias applied to the first gain stage based on the first output signal and the second output signal;
a third gain stage having fifth and sixth transistors;
a third replica stage having a fifth transistor to substantially match the fifth transistor of the third gain stage and a sixth transistor to substantially match the sixth transistor of the third gain stage, the third replica stage to provide a third output signal; and
another biasing device to receive the second output signal from the second replica stage and to receive the third output signal from the third replica stage and to adjust a DC bias applied to the third gain stage based on the second output signal and the third output signal.

4. A system comprising:
a receiving device to receive data;
a memory device to store the received data; and
a processing device to process the data, the receiving device including:
a first gain stage having first and second transistors;
a second gain stage having third and fourth transistors;
a first replica stage and a second replica stage, each corresponding with one of the plurality of gain stages; and
an amplifying device to receive an output signal from the first replica stage and to receive an output signal from the second replica stage, the amplifying device to adjust a DC bias condition based on the received output signal from the first replica stage and the received output signal from the second replica stage, the first replica stage including a first transistor corresponding to the first transistor of the first gain stage and a second transistor corresponding to the second transistor of the second gain stage, and the amplifying device to adjust a body potential applied to the first transistor of the first gain stage and the first transistor of the first replica stage.

5. The amplification apparatus of claim 1, wherein the amplifying device adjusts the body potential of at least the first transistor of the first gain stage based on an output of the first replica stage and an output of the second replica stage.

6. The amplification apparatus of claim 1, wherein the first replica stage corresponds with the first gain stage and the second replica stage corresponds with the second gain stage.

7. The amplification apparatus of claim 6, wherein the first replica stage includes a first transistor corresponding to the first transistor of the first gain stage and a second transistor corresponding to the second transistor of the second gain stage.

8. The amplification apparatus of claim 7, wherein the amplifying device further adjusts the body potential of the first transistor of the first replica stage.

9. The amplification apparatus of claim 7, wherein the second replica stage includes a third transistor corresponding to the third transistor of the second gain stage and a fourth transistor corresponding to the fourth transistor of the second gain stage.

10. The amplification apparatus of claim 9, wherein inputs of the first transistor and the second transistor of the first replica stage are commonly coupled to outputs of the first transistor and the second transistor of the first replica stage, and the outputs of the first replica stage are coupled to one input of the amplifying device.

11. The amplification apparatus of claim 10, wherein inputs of the third transistor and the fourth transistor of the second replica stage are commonly coupled to outputs of the third transistor and the fourth transistor of the second replica stage, and the outputs of the second replica stage are coupled to another input of the amplifying device.

12. The amplification apparatus of claim 1, further comprising a third gain stage, a third replica stage, and another amplifying device coupled to the second replica stage and the third replica stage, the another amplifying device to adjust a body potential of at least the third transistor of the second gain stage.

13. The amplification apparatus of claim 1, wherein the first gain stage outputs a signal corresponding to a DC bias condition of the second gain stage.

14. The amplification apparatus of claim 13, wherein the signal corresponding to the DC bias condition is adjusted based on the body potential output by the amplifying device.

15. The amplification apparatus of claim 1, wherein the amplifying device applies a forward bias to body-to-source diodes of at least the first transistor to reduce a threshold value.

16. The amplification apparatus of claim 1, wherein the amplifying device adjusts the body potential within a bias range that covers forward and reverse bias of body-to-source diodes of at least the first transistor.

17. The amplification apparatus of claim 1, wherein the first replica stage provides a first replica stage output and the second replica stage provides a second replica stage output, the amplifying device to receive the first replica stage output from the first replica stage and to receive the second replica stage output from the second replica stage, the amplifying device to adjust the body potential based on the received first replica stage output and the received second replica stage output.

18. The apparatus of claim 3, wherein the biasing device provides a body potential to at least the first transistor of the first gain stage.

19. The apparatus of claim 18, wherein the biasing device further provides the body potential to the first transistor of the first replica stage.

20. The apparatus of claim 2, wherein the biasing device applies a forward bias to body-to-source diodes to reduce a threshold voltage.

21. The apparatus of claim 2, wherein the biasing device adjusts a body potential within a bias range that covers forward and reverse bias of body-to-source diodes of the first transistor of the first replica stage.

22. The apparatus of claim 2, wherein inputs of the first transistor and the second transistor of the first replica stage are commonly coupled to outputs of the first transistor and the second transistor of the first replica stage, and the outputs of the first replica stage are coupled to one input of the biasing device.

23. The apparatus of claim 22, wherein inputs of the third transistor and the fourth transistor of the second replica stage are commonly coupled to outputs of the third transistor and the fourth transistor of the second replica stage, and the outputs of the second replica stage are coupled to another input of the biasing device.

24. The apparatus of claim 2, wherein the first and second transistors having commonly coupled drains and the third and fourth transistors having commonly coupled gates, the first gain stage to provide an output from the commonly coupled drains of the first and second transistors to the commonly coupled gates of the third and fourth transistors of the second gain stage.

25. The system of claim 4, further comprising a device to output data.

26. The system of claim 4, wherein the amplifying device adjusts the DC bias condition by adjusting a body potential applied to the first transistor of the first gain stage.

27. The system of claim 4, wherein the second replica stage includes a third transistor corresponding to the third transistor of the second gain stage and a fourth transistor corresponding to the fourth transistor of the second gain stage.

28. The system of claim 4, wherein the first and second transistors having commonly coupled drains and the third and fourth transistors having commonly coupled gates, the first gain stage to provide an output from the commonly coupled drains of the first and second transistors to the commonly coupled gates of the third and fourth transistors of the second gain stage.

* * * * *